(12) United States Patent
Uchida et al.

(10) Patent No.: US 10,582,632 B2
(45) Date of Patent: Mar. 3, 2020

(54) BOARD UNIT

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

(72) Inventors: Koki Uchida, Mie (JP); Jun Ikeda, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 0 days.

(21) Appl. No.: 16/305,933

(22) PCT Filed: May 31, 2017

(86) PCT No.: PCT/JP2017/020334
§ 371 (c)(1),
(2) Date: Nov. 30, 2018

(87) PCT Pub. No.: WO2017/209203
PCT Pub. Date: Dec. 7, 2017

(65) Prior Publication Data
US 2019/0307008 A1    Oct. 3, 2019

(30) Foreign Application Priority Data
Jun. 2, 2016   (JP) .................................. 2016-111348

(51) Int. Cl.
*H05K 5/02*        (2006.01)
*H05K 5/06*        (2006.01)

(52) U.S. Cl.
CPC ............... *H05K 5/068* (2013.01); *H05K 5/02* (2013.01); *H05K 5/0217* (2013.01)

(58) Field of Classification Search
None
See application file for complete search history.

(56) References Cited

U.S. PATENT DOCUMENTS 7,008,240 B1 * 3/2006 Wang .................. H05K 5/0217
                                                           361/737
8,665,601 B1 * 3/2014 Mangay-Ayam, Jr. .. G11C 5/04
                                                           361/752

(Continued)

FOREIGN PATENT DOCUMENTS

JP        2001007561 A      1/2001
JP        2010177616 A      8/2010

(Continued)

OTHER PUBLICATIONS

International Search Report, Application No. PCT/JP2017/020334 dated Aug. 29, 2017.

*Primary Examiner* — Xanthia C Cunningham
(74) *Attorney, Agent, or Firm* — Honigman LLP

(57) ABSTRACT

The present disclosure provides a board unit including: a circuit board; a connector portion that is mounted on the circuit board; and a case that houses the circuit board. The case includes: a lower case that has an upper opening; an upper cover that covers the upper opening of the lower case; and an opening portion that is formed in a side wall of the case so as to allow the connector portion to be fitted to a mating connector portion. The side wall includes: a step surface that extends outward from a lower region of the opening portion; and a plurality of vertical groove portions whose first ends are connected to the step surface and whose second ends are connected to a lower edge of the side wall.

10 Claims, 4 Drawing Sheets

(56) References Cited

U.S. PATENT DOCUMENTS

| | | | | |
|---|---|---|---|---|
| 9,853,432 B2* | 12/2017 | Sasaki | ............... | H02G 3/16 |
| 2013/0265728 A1 | 10/2013 | Sakai | | |
| 2015/0201505 A1* | 7/2015 | Hu | ............... | H05K 5/0013 |
| | | | | 312/223.1 |
| 2015/0208525 A1* | 7/2015 | Negishi | ............... | H05K 5/0056 |
| | | | | 361/752 |
| 2015/0289399 A1* | 10/2015 | Liao | ............... | H05K 7/1417 |
| | | | | 361/747 |
| 2017/0150619 A1* | 5/2017 | Kojima | ............... | H05K 5/0052 |

FOREIGN PATENT DOCUMENTS

| | | | |
|---|---|---|---|
| JP | 2011150895 A | 8/2011 | |
| JP | 2011229253 A | 11/2011 | |
| WO | 2013042714 A1 | 3/2013 | |
| WO | 2013046261 A1 | 4/2013 | |

* cited by examiner

BOARD UNIT

CROSS-REFERENCE TO RELATED APPLICATIONS

This application is the U.S. national stage of PCT/JP2017/020334 filed May 31, 2017, which claims priority of Japanese Patent Application No. JP 2016-111348 filed Jun. 2, 2016.

TECHNICAL FIELD

The present disclosure relates to a board unit.

BACKGROUND

JP 2014-175365A discloses a vehicle-mounted case or the like in which an electric device is housed that is equipped with a waterproofing structure for preventing failure of the housed electric device caused by water entering the case.

The method disclosed in JP 2014-175365A describes a case that is hermetically sealed by a seal member, which increases the production cost.

Accordingly, it is an object of the present disclosure to provide a board unit that can keep water from entering the housing space by using a simple configuration.

A board unit according to the present disclosure includes a circuit board and a connector portion that is mounted on the circuit board. A case houses the circuit board. The case includes a lower case that has an upper opening; an upper cover that covers the upper opening of the lower case; and an opening portion that is formed in a side wall of the case so as to allow the connector portion to be fitted to a mating connector portion. The side wall includes a step surface that extends outward from a lower region of the opening portion and a plurality of vertical groove portions whose first ends are connected to the step surface and whose second ends are connected to a lower edge of the side wall.

According to the present disclosure, it is possible to provide a board unit that can keep water from entering the housing space by using a simple configuration.

DETAILED DESCRIPTION OF PREFERRED EMBODIMENTS

Figure 1:
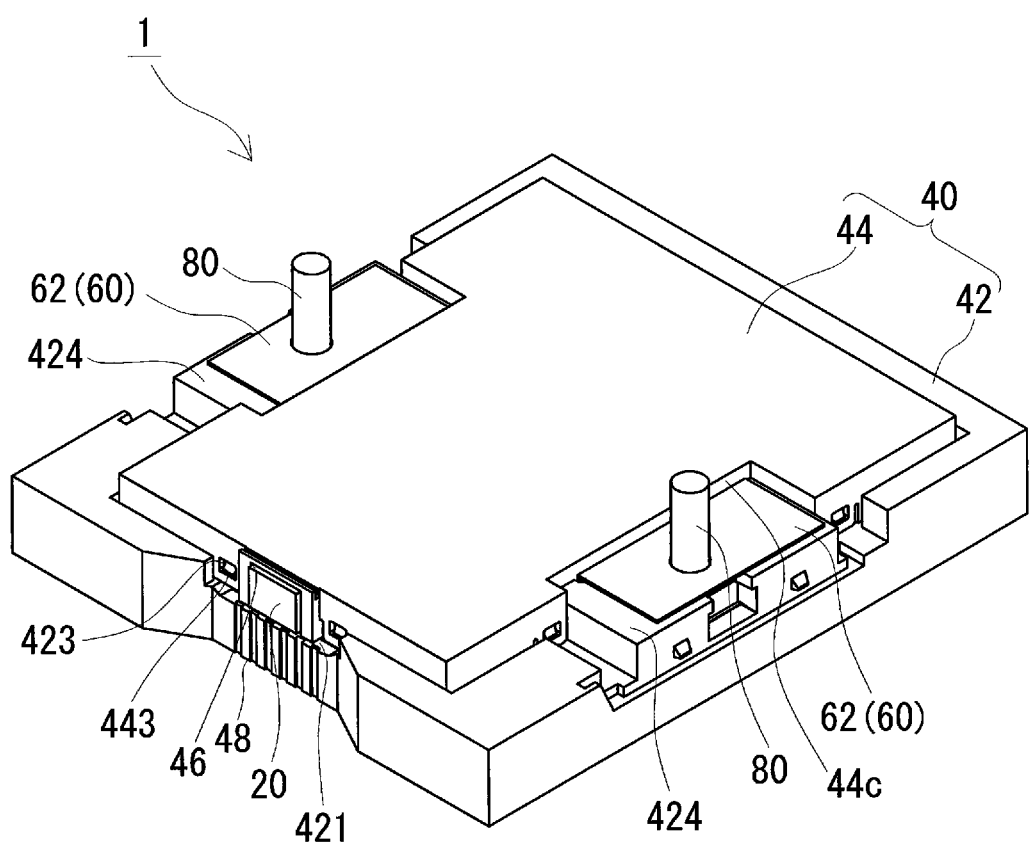
FIG. 1 is a schematic perspective view of a board unit according to Embodiment 1.

First, examples of embodiments according to the present disclosure are given and described.

A board unit according to an embodiment of the present disclosure includes a circuit board and a connector portion that is mounted on the circuit board. A case houses the circuit board. The case includes a lower case that has an upper opening; an upper cover that covers the upper opening of the lower case; and an opening portion that is formed in a side wall of the case so as to allow the connector portion to be fitted to a mating connector portion. The side wall includes: a step surface that extends outward from a lower region of the opening portion; and a plurality of vertical groove portions whose first ends are connected to the step surface and whose second ends are connected to a lower edge of the side wall.

The circuit board may be damaged by water droplets falling onto the board unit from above and entering the case. For example, water falling onto the case of the board unit from above may flow toward the opening portion formed in the side wall along the surface of the case. When there is a step surface in the lower region of the opening portion, the water flowing toward the opening portion may accumulate on the step surface and enter the case from the opening portion. However, with the configuration described above, vertical groove portions connected to the step surface are provided, and thus the water that has accumulated on the step surface can be guided to the lower edge of the side wall along the vertical groove portions. Accordingly, it is possible to keep the water that has accumulated on the step surface from entering the case from the opening portion. With the configuration described above, because the vertical groove portions are formed in the side wall of the case, it is unnecessary to separately provide a seal member, and thus the configuration is simplified. Accordingly, the board unit also has excellent assembling workability.

As an example of the board unit, the board unit may be configured such that the side wall includes a protruding portion that covers the connector portion and protrudes outward, and a lower end portion of the protruding portion is located lower than a lower edge of the opening portion.

Because a protruding portion is provided that covers the connector portion and whose lower end portion is located lower than the lower edge of the opening portion, the protruding portion can surround the upper side and both sides of the opening portion. Because the lower end portion of the protruding portion is located lower than the lower edge of the opening portion, it is possible to keep water flowing along the side outer surfaces of the protruding portion from entering the case from the opening portion while the water flows along the side outer surfaces, and thus reliably guide the water to the step surface. The water that has flowed to the step surface from the lower end portion of the protruding portion can be guided to the lower edge of the case along the vertical groove portions.

As an example of the board unit that includes the protruding portion, the board unit may be configured such that the protruding portion includes a horizontal groove portion formed in an upper outer surface thereof, extending in opposing lateral directions.

As a result of the horizontal groove portion being formed in the upper outer surface of the protruding portion, water that has flowed to the upper outer surface of the protruding portion falls into the horizontal groove portion. Because the horizontal groove portion extends in opposing lateral directions of the protruding portion, the water that has fallen into the horizontal groove portion inevitably flows along the side outer surfaces of the protruding portion. Accordingly, it is possible to keep water from flowing from the upper outer surface to the end faces of the protruding portion and entering the case from the opening portion. Because the lower end portion of the protruding portion is located lower than the lower edge of the opening portion, the water can be reliably guided to the step surface and then to the lower edge of the case along the vertical groove portions.

As an example of the board unit, the board unit may be configured such that the vertical groove portions each include an upper end portion that is provided with an inclined shape or a curved shape that is inclined downward.

With the configuration described above, the water that has accumulated on the step surface is likely to be guided toward the vertical groove portions.

As an example of the board unit, the board unit may be configured such that the vertical groove portions each have a width that causes a capillary phenomenon to occur.

With the configuration described above, the water that has accumulated on the step surface can be guided to the lower edge of the case along the vertical groove portions while attracting the water to the vertical groove portions. Accordingly, water is unlikely to accumulate on the step surface.

Hereinafter, a board unit according to an embodiment of the present disclosure will be described in detail with reference to the drawings. In the diagrams, the same reference numerals indicate the same structural elements.

Embodiment 1

A board unit 1 according to Embodiment 1 will be described with reference to FIGS. 1 to 5. The board unit 1 includes a circuit board 10, a connector portion 20 that is mounted on the circuit board 10, and a case 40 that houses the circuit board 10. The case 40 includes a lower case 42 that has an upper opening, an upper cover 44 that covers the upper opening of the lower case 42, and an opening portion 46 that is formed in a side wall of the case 40. The opening portion 46 has an opening so as to allow the connector portion 20 to be fitted to a mating connector portion (not shown). One feature of the board unit 1 according to Embodiment 1 is that a waterproofing structure for preventing water entering the case 40 from the opening portion 46 is provided in a side wall of the case 40. Hereinafter, the constituent elements will be described in detail first, and then, a flow of water in the waterproofing structure will be described. In the description given below, in the board unit 1, the side on which the lower case 42 of the case 40 is provided is defined as the "lower" side, and the side on which the upper cover 44 is provided is defined as the "upper" side. Also, the side in a direction perpendicular to the up-down direction of the case 40 and on which the connector portion 20 is provided is defined as the "front" side, and the opposite side is defined as the "rear" side.

Circuit Board

Figure 2:
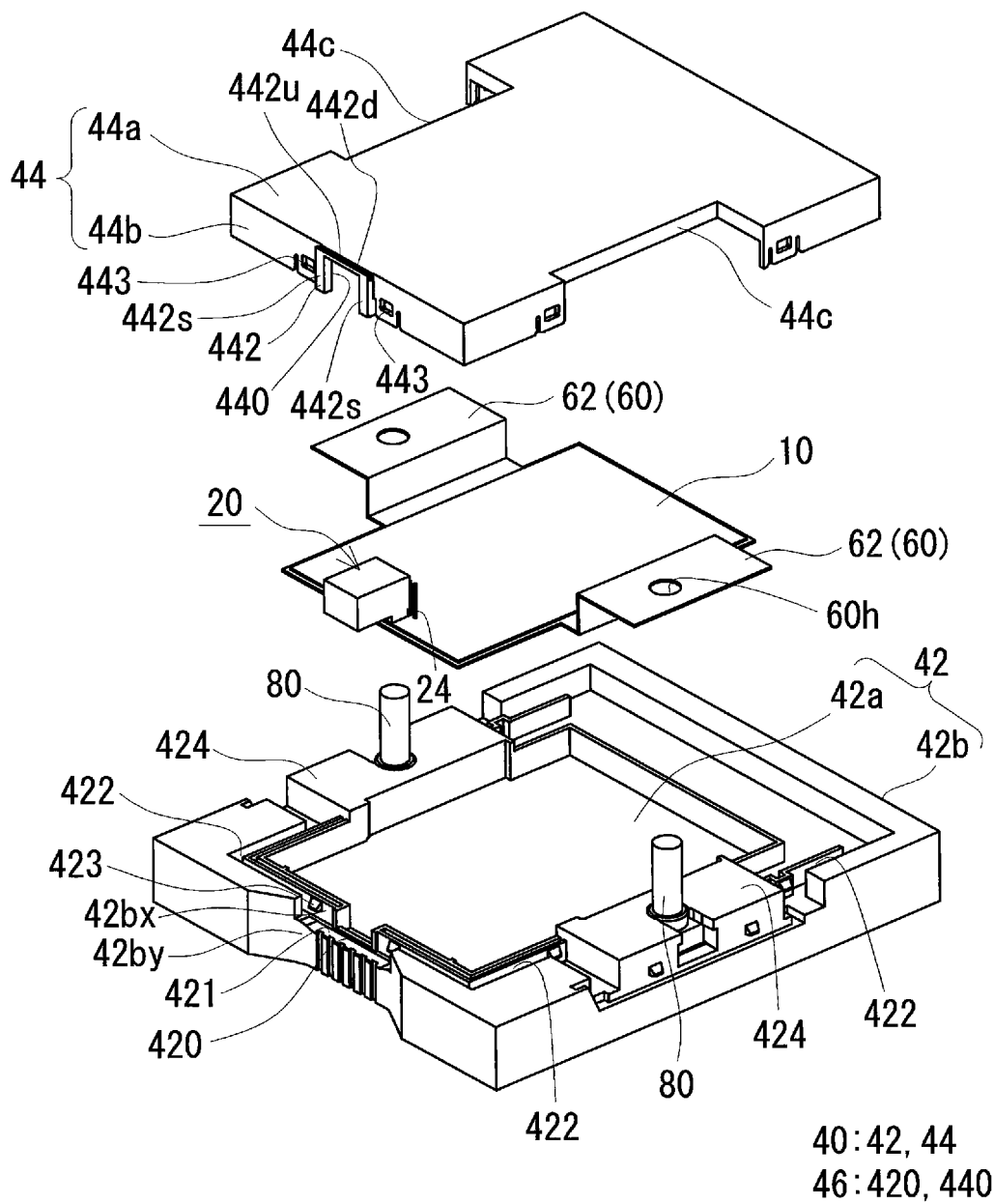
FIG. 2 is a schematic exploded perspective view of the board unit according to Embodiment 1.
Figure 3:
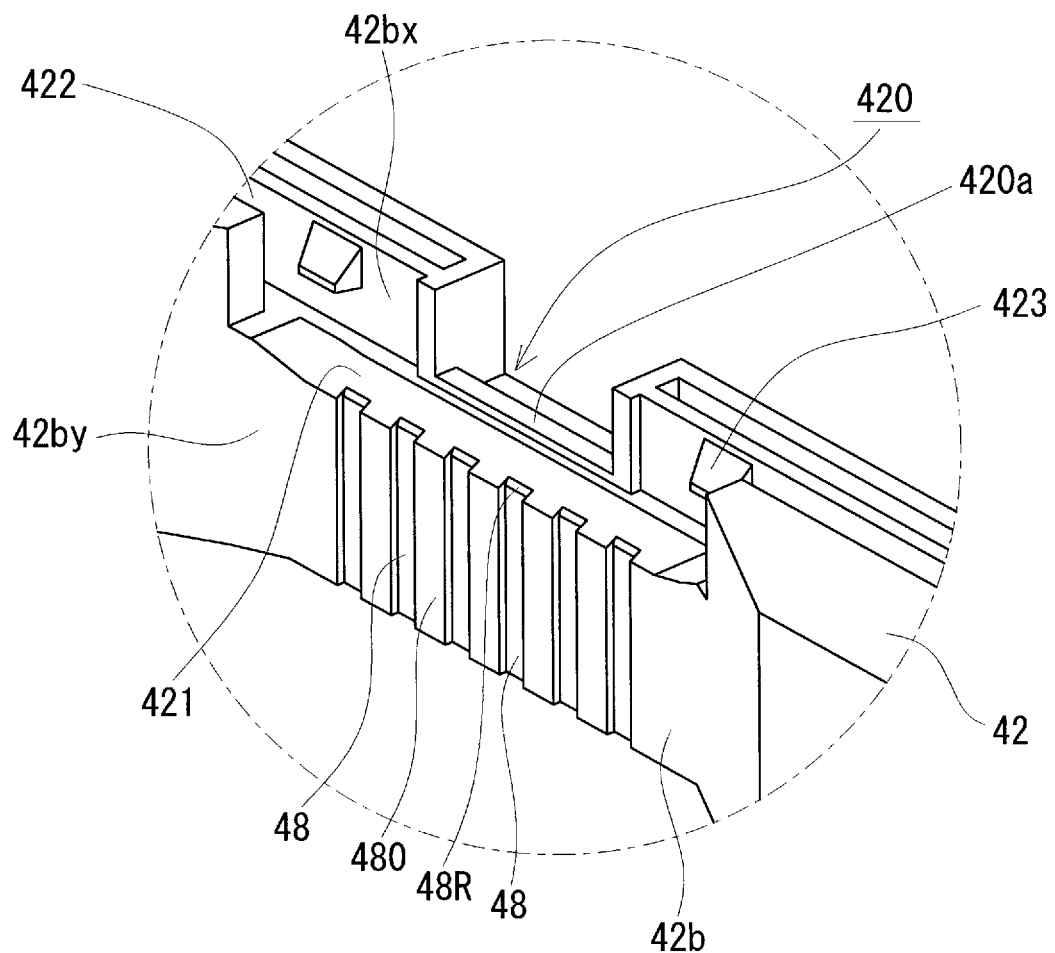
FIG. 3 is an enlarged schematic view showing the vicinity of a lower recess portion of a lower case of the board unit according to Embodiment 1.

As shown in FIG. 2, the circuit board 10 is a substantially rectangular printed circuit board that is disposed on a bus bar 60, which will be described later, and on which a conductive pattern (not shown) is formed on a side opposite to the side on which the bus bar 60 is disposed. A conductive path formed in the conductive pattern is used as, for example, a control conductive path (a portion of a circuit). Electronic components (not shown) such as a switching element and a connector portion 20, which will be described later, are mounted on the circuit board 10.

Connector Portion

As shown in FIG. 2, the connector portion 20 is attached to the circumferential edge portion of the circuit board 10. In the connector portion 20, a connector terminal 24 is housed in a housing, the connector terminal 24 extending to the rear side of the housing and being soldered to the conductive path of the circuit board 10. A mating connector portion (not shown) such as a connector portion of an external control apparatus is connected to the connector portion 20.

Case

Figure 4:
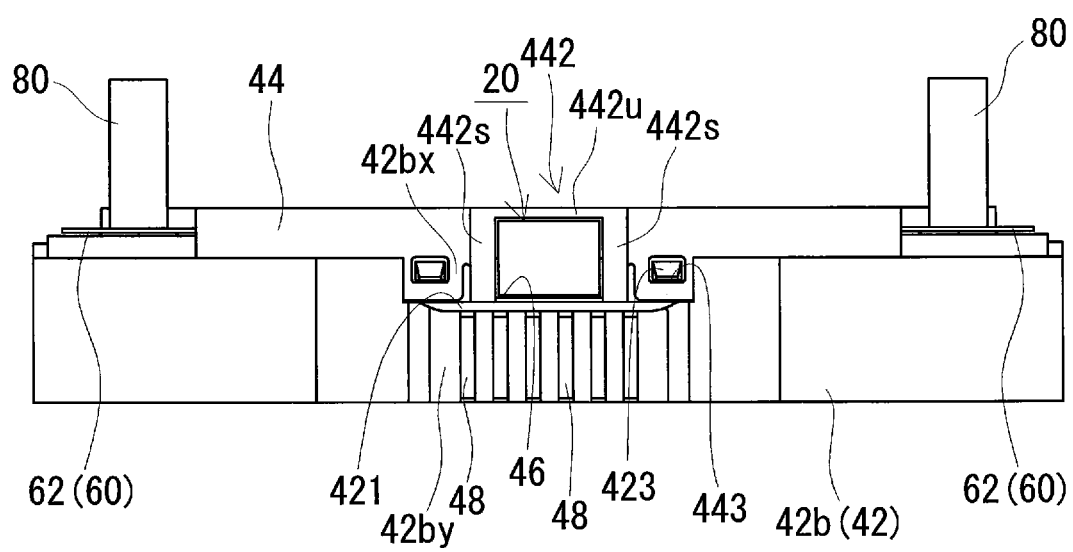
FIG. 4 is a front view of the board unit according to Embodiment 1.

As shown in FIGS. 1 and 2, the case 40 includes a lower case 42 that has an upper opening and an the upper cover 44 that covers the upper opening of the lower case 42. The circuit board 10 and the connector portion 20 are housed in an internal space formed by combining the lower case 42 and the upper cover 44. Also, in a side wall that is formed by combining the lower case 42 and the upper cover 44, an opening portion 46 is formed by the lower case 42 and the upper cover 44, the opening portion 46 being formed so as to allow the connector portion 20 to be fitted to a mating connector portion (FIG. 4). The connector portion 20 is interposed between the lower case 42 and the upper cover 44, and positioned with respect to the case 40. One feature of the board unit 1 according to Embodiment 1 is that the side wall of the case 40 includes: a step surface 421 that extends outward from a lower region of the opening portion 46; and a plurality of vertical groove portions 48 that function as a waterproofing structure of the case 40, each groove portion 48 including a first end that is connected to the step surface 421 and a second end that is connected to a lower edge of the side wall.

Lower Case

As shown in FIG. 2, the lower case 42 has a substantially rectangular box shape that includes a flat plate-like bottom portion 42a on which the circuit board 10 and a bus bar 60, which will be described later, are placed, and a substantially rectangular frame-like side wall portion 42b that is provided so as to shallowly stand upright from a circumferential edge of the bottom portion 42a, and has an opening on a side (upper side) opposite to the bottom portion 42a. The bottom portion 42a and the side wall portion 42b may be molded into a unitary member, or may be independent members that are not unitarily molded, or may be formed into a unitary body by using fixing members such as bolts.

The bottom portion 42a has a rectangular shape that is slightly larger than that of the circuit board 10, and is composed of a heat sink that dissipates heat generated from the electronic components mounted on the circuit board 10. As the heat sink 42a, it is possible to use, for example, a highly heat-conductive metal plate made of aluminum, copper or the like that has been subjected to insulation coating.

As shown in FIG. 2, the side wall portion 42b is a frame body that is continuous over the entire circumference of the bottom portion 42a, and surrounds four outer circumferential sides of the circuit board 10 that includes the connector portion 20. The side wall portion 42b includes a lower recess portion 420 in a center portion of the front side of the case 40. The lower recess portion 420 forms, together with an upper recess portion 440 of an upper cover 44, which will be described later, the opening portion 46 within which the connector portion 20 is disposed. Here, a lower surface 420a (FIG. 3) that is on the outer side of the lower recess portion 420 serves as the lower edge of the opening portion 46. The size of the lower recess portion 420 can be selected as appropriate such that the connector portion 20 can be disposed in the opening portion 46 that is formed by the lower recess portion 420 and the upper recess portion 440, and the connector portion 20 can be positioned with respect to the case 40.

The side wall portion 42b includes: an upper side wall portion 42bx in which the lower recess portion 420 is formed; a lower side wall portion 42by that is located in a lower region of the upper side wall portion 42bx; and a step surface 421 that extends outward between the upper side wall portion 42bx and the lower side wall portion 42by. The step surface 421 is provided so as to ensure the strength (rigidity) of the lower case 42. In this example, the step surface 421 is formed by a surface that intersects the upper side wall portion 42*bx* and the lower side wall portion 42*by*. The step surface 421 includes a flat-plate shaped low step portion that is perpendicular to the outer surface of the side wall portion 42*b* in a center portion of the step surface 421, and high step portions that are provided on both sides of the low step portion, the high step portions being connected to each side of the low step portion by a curved surface and located higher than the low step portion. The high step portions are continuous with an insertion groove 422, which will be described later. Vertical groove portions 48, which will be described later, are formed in an outer surface of the lower side wall portion 42*by*.

As shown in FIG. 2, the side wall portion 42*b* includes, in a portion of the upper surface in the circumferential direction, an insertion groove 422 into which a side wall portion 44*b* of the upper cover 44 is inserted, and an engagement portion (engaging projection 423) for fixing the side wall portion 44*b* of the upper cover 44 that has been inserted into the insertion grooves 422. The insertion groove 422 is provided with a shape that conforms to the shape of the side wall portion 44*b* of the upper cover 44. The engaging projections 423 are provided at appropriate positions on the side wall portion 42*b* in the circumferential direction such as on the front side wall portion 42*b* and the right and left side wall portions 42*b*.

A platform portion 424 on which an extension portion 62 of the bus bar 60 is placed, which will be described later, is provided on the upper surface of each of the right and left side wall portions 42*b*. A male screw portion 80 is attached to each platform portion 424 so as to protrude upward from the upper surface of the platform 424. Each male screw portion 80 includes a head portion and a shaft portion, and the head portion is fixed to the platform portion 424. In this example, the platform portion 424 includes a cut-out into which the head portion of the male screw portion 80 can be laterally inserted, and a fixing portion for fixing the head portion of the male screw portion 80 in the cut-out.

The lower case 42 is made of, for example, a synthetic resin such as polypropylene (PP) or polyamide (PA).
Upper Cover As shown in FIG. 2, the upper cover 44 is configured to cover the upper opening of the lower case 42, and is a unitary body formed by a flat plate-like roof portion 44*a* that forms the upper surface of the case 40, and a substantially rectangular frame-like side wall portion 44*b* that is provided so as to shallowly stand upright from a circumferential edge of the roof portion 44*a*. As a result of the side wall portion 44*b* being inserted into the insertion groove 422 of the lower case 42 and the engaging projections 423 of the lower case 42 being engaged with engaging holes 443 formed in the side wall portion 44*b*, the upper cover 44 is fixed to the lower case 42, forming a unitary body.

The upper cover 44 is provided with a shape that covers the lower case 42, with the platform portions 424 of the lower case 42 being exposed, and includes cut-out portions 44*c* formed in portions of the outer wall. With the cut-out portions 44*c*, it is possible to ensure gaps in which the extension portions 62 of the bus bar 60 can be placed even in a state in which the upper cover 44 is fixed to the lower case 42. With these gaps, the extension portions 62 of the bus bar 60 can be placed on the upper surfaces of the platform portions 424.

The side wall portion 44*b* includes an upper recess portion 440 in a center portion on the front side of the case 40. The upper recess portion 440 forms, together with the lower recess portion 420 of the lower case 42, the opening portion 46 within which the connector portion 20 is provided. In this example, the connector portion 20 is disposed such that the leading end side is exposed to the outside of the case 40. The side wall portion 44*b* includes a protruding portion 442 that covers the exposed portion of the connector portion 20 and protrudes outward. As shown in FIG. 4, the protruding portion 442 has an inverted U-shape including an upper portion 442*u* that surrounds the upper side and both sides of the connector portion 20, and side portions 442*s* and 442*s*. A lower end portion of the protruding portion 442 (a lower end portion of each of the side portions 442*s* and 442*s*) is located lower than the lower edge of the opening portion 46 (the connector portion 20). In this example, the lower end portion of the protruding portion 442 is located slightly spaced apart from the step surface 421 of the lower case 42.

Figure 5:
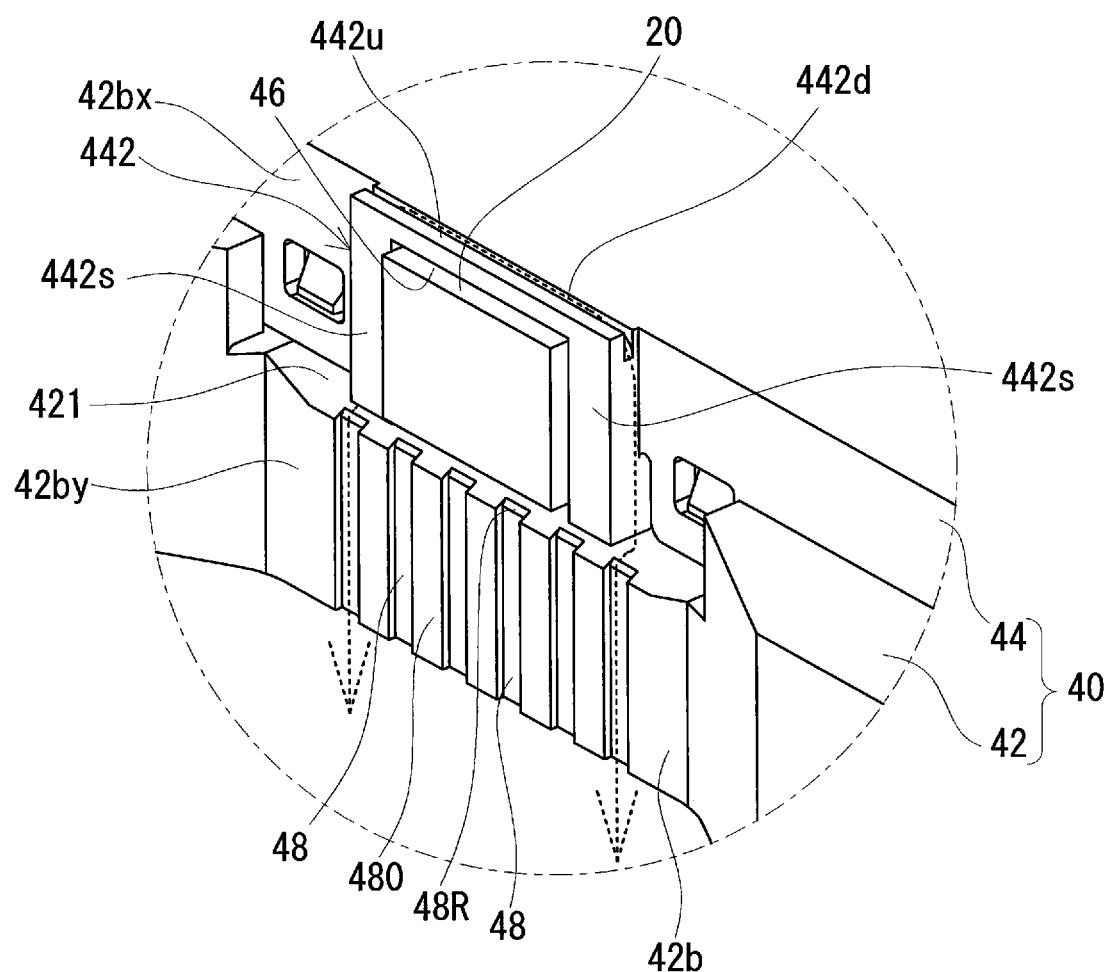
FIG. 5 is an enlarged schematic view showing the vicinity of an opening portion of a case of the board unit according to Embodiment 1.

The protruding portion 442 includes a horizontal groove portion 442*d* formed in an outer surface of the upper portion 442*u*, extending toward the side portions 442*s* and 442*s* (FIGS. 2 and 5). In this example, the bottom surface of the horizontal groove portion 442*d* is a flat surface that extends in the lengthwise direction. The bottom surface of the horizontal groove portion 442*d* may be an inclined surface or a curved surface with its center portion in the longitudinal direction being higher than its side portions that correspond to the side portions 442*s* and 442*s*.

Like the lower case 42, the upper cover 44 is made of, for example, a synthetic resin such as polypropylene (PP) or polyamide (PA).
Vertical Groove Portions The vertical groove portions 48 are formed in a lower region of the step surface 421 of the side wall portion 42*b* of the lower case 42. Each vertical groove portion 48 includes a first end that is connected to the step surface 421 and a second end that is connected to the lower edge of the side wall portion 42*b*. It is preferable that the vertical groove portions 48 are formed in a region that corresponds to the low step portion of the step surface 421 (see FIG. 4).

It is preferable that the vertical groove portions 48 each have a width that causes a capillary phenomenon to occur. Due to the occurrence of a capillary phenomenon where the vertical groove portions 48 constitute capillary tubes, it is possible to effectively guide a flow of water, which will be described later. The smaller the width of the vertical groove portions 48, the higher the effect of the capillary phenomenon. However, if the width is too small, water does not flow smoothly.

It is preferable that the plurality of vertical groove portions 48 are formed in a region that corresponds to the low step portion of the step surface 421. A flow of water, which will be described later, can be guided more effectively as the number of vertical groove portions 48 is higher. However, if there are too many vertical groove portions 48, the width of the vertical groove portions 48 may be reduced, or the portions (ridge portions 480) between adjacent vertical groove portions 48 may have a small width. If the width C of the ridge portion 480 is too small, adjacent vertical groove portions 48 are unlikely to be separated, and a capillary phenomenon may be unlikely to occur.

It is preferable that the vertical groove portions 48 are formed uniformly in a region that corresponds to the center portion of the step surface 421 according to the width that causes a capillary phenomenon to occur, the number of vertical groove portions, and the width of the ridge portions 480.

Each vertical groove portion 48 includes, on its upper end portion, a curved groove portion 48R that has a curved shape that is inclined downward. Other than the curved shape, the curved groove portion 48R may also have an inclined shape. Likewise, the upper end portion of each ridge portion 480 may also have a curved shape or an inclined shape that is inclined downward.

Bus Bar

The bus bar 60 is a plate-like member that constitutes an electric power circuit. The bus bar 60 is composed of a plurality of bus bar pieces that are arranged in a predetermined layout. As shown in FIG. 2, the bus bar 60 includes a main body portion on which the circuit board 10 is placed, and extension portions 62 that are molded unitarily with the main body portion, and that protrude from the main body portion and are bent in a step shape. The main body portion of the bus bar 60 is fixed to a surface of the circuit board 10 that is opposite to the surface on which a conductive pattern is formed, using, for example, an insulating adhesive, an adhesive sheet, or the like. Accordingly, the circuit board 10 and the bus bar 60 can be treated as a unitary body. Also, in the main body portion of the bus bar 60, the bottom portion (heat sink) 42a of the lower case 42 is disposed on a surface opposite to the surface on which the circuit board 10 is placed.

Each extension portion 62 of the bus bar 60 is a portion to which an external device is electrically connected, and a connection terminal of an unshown electric line (wire harness) is electrically connected to the extension portion 62. A through hole 60h through which the male screw portion 80 passes is formed in the extension portion 62. The bus bar 60 can be electrically connected to an external device by inserting the shaft portions of the male screw portions 80 into the through holes 60h of the bus bar 60, placing the extension portions 62 on the upper surfaces of the platform portions 424, and fastening with nuts together with connection terminals (not shown) of electric lines. In this example, the extension portion 62 is provided on each of two opposing sides of the main body portion of the bus bar 60, and the connection terminals of respective electric lines are electrically connected to the extension portions 62.

Flow of Water in Waterproofing Structure

A flow of water in the board unit 1 configured as described above will be described with reference to FIG. 5. In FIG. 5, dotted lines indicate the flow of water. When water falling onto the board unit 1 from above flows toward the opening portion 46 (the connector portion 20), the water falls into the horizontal groove portion 442d formed in the outer surface of the upper portion 442u of the protruding portion 442. The water that has fallen into the horizontal groove portion 442d flows toward the side portions 442s of the protruding portion 442, and then flows downward along the side portions 442s. Because the lower end portions of the side portions 442s of the protruding portion 442 are located lower than the lower edge of the opening portion 46 (the connector portion 20), the water that has flowed to the side portions 442s flows to the step surface 421 from the lower end portions of the side portions 442s, and accumulates on the step surface 421. The water that has accumulated on the step surface 421 is guided to the lower edge of the side wall portion 42b along the vertical groove portions 48 that connect the step surface 421 and the side wall portion 42b of the lower case 42.

In addition to the above, because the step surface 421 includes a low step portion and high step portions, even if water enters the insertion groove 422 (FIGS. 2 and 3) that serves as the boundary between the lower case 42 and the upper cover 44, the water that has entered the insertion groove 422 flows to the high step portions of the step surface 421 when the case itself is inclined such that the connector portion 20 side faces downward with respect to the vehicle. The water that has flowed to the high step portions is guided to the low step portion via the curved surfaces, and further guided to the lower edge of the side wall portion 42b along the vertical groove portions 48.

Advantageous Effects

Because the board unit 1 includes the vertical groove portion 48 that are connected to the step surface 421, the water accumulated on the step surface 421 can be guided to the lower edge of the side wall portion 42b along the vertical groove portions 48. Accordingly, it is possible to prevent water that has accumulated on the step surface 421 from entering the case 40 from the opening portion 46. In particular, because the vertical groove portions 48 each have a width that causes a capillary phenomenon to occur, the water that has accumulated on the step surface 421 can be guided to the lower edge of the side wall portion 42b along the vertical groove portions 48 while attracting the water to the vertical groove portions 48. Accordingly, it is possible to effectively keep water from entering the case.

Because the protruding portion 442 is provided that covers the connector portion 20 and whose lower end portion (the side portion 442s) is located lower than the lower edge of the connector portion 20 (the opening portion 46), the protruding portion 442 can surround the upper side and both sides of the opening portion 46, and thus water is unlikely to enter the case 40 from the opening portion 46. Also, when water flows along the side portions 442s of the protruding portion 442, because the lower end portions of the side portions 442s are located lower than the lower edge of the opening portion 46, the water droplets can be reliably guided to the step surface 421. The water that has flowed to the step surface 421 is guided to the lower edge of the side wall portion 42b along the vertical groove portions 48.

Because the horizontal groove portion 442d is formed in the upper portion 442u of the protruding portion 442, water that has flowed to the upper portion 442u of the protruding portion 442 falls into the horizontal groove portion 442d. Accordingly, it is possible to prevent the water from flowing from the end faces of the upper portion 442u of the protruding portion 442 to the end faces of the opening portion 46 and entering the case 40 from the opening portion 46. The water droplets that have fallen into the horizontal groove portion 442d flows toward the side portions 442s of the protruding portion 442, and flows downward along the side portions 442s. Accordingly, it is possible to reliably guide the water droplets to the step surface 421, and to the lower edge of the side wall portion 42b along the vertical groove portions 48.

As described above, with the board unit 1 described above, a structure that guides water to the lower edge of the side wall portion 42b of the case 40 is formed in the case 40, and it is therefore possible to keep water from entering the case by using a simple configuration, without separately providing a seal member. Accordingly, in the case where it is necessary to ensure waterproofness against water droplets (droplet proofness), by using the board unit 1, the number of components can be reduced, and the assembling workability can be improved.

Applications

The board unit described above can be used in a high current power control unit mounted on a vehicle (an automobile or the like) such as, for example, a direct current voltage converter, an AC/DC converter, or a DC/AC inverter.

The present disclosure is not limited to the examples given above. The scope of the present disclosure is indicated by the appended claims, and all changes that come within the meaning and range of equivalency of the claims are intended to be embraced within the scope of the present disclosure. It is possible to change, for example, the specifications (size, shape, number, and the like) of the vertical groove portions and the horizontal groove portion, the specifications (size, shape, and the like) of the case, and the like.

The invention claimed is:

1. A board unit comprising:
    a circuit board;
    a connector portion that is mounted on the circuit board; and
    a case that houses the circuit board,
    wherein the case includes:
        a lower case that has an upper opening;
        an upper cover that covers the upper opening of the lower case; and
        an opening portion that is formed in a side wall of the case so as to allow the connector portion to be fitted to a mating connector portion, and
    the side wall includes:
        a step surface that extends outward from a lower region of the opening portion; and
        a plurality of vertical groove portions whose first ends are connected to the step surface and whose second ends are connected to a lower edge of the side wall.

2. The board unit according to claim 1,
    wherein the side wall includes a protruding portion that covers the connector portion and protrudes outward, and
    a lower end portion of the protruding portion is located lower than a lower edge of the opening portion.

3. The board unit according to claim 2,
    wherein the protruding portion includes a horizontal groove portion formed in an upper outer surface thereof, extending in opposing lateral directions.

4. The board unit according to claim 1, wherein the vertical groove portions each include an upper end portion that is provided with an inclined shape or a curved shape that is inclined downward.

5. The board unit according to claim 1, wherein the vertical groove portions each have a width that causes a capillary phenomenon to occur.

6. The board unit according to claim 2, wherein the vertical groove portions each include an upper end portion that is provided with an inclined shape or a curved shape that is inclined downward.

7. The board unit according to claim 3, wherein the vertical groove portions each include an upper end portion that is provided with an inclined shape or a curved shape that is inclined downward.

8. The board unit according to claim 2, wherein the vertical groove portions each have a width that causes a capillary phenomenon to occur.

9. The board unit according to claim 3, wherein the vertical groove portions each have a width that causes a capillary phenomenon to occur.

10. The board unit according to claim 4, wherein the vertical groove portions each have a width that causes a capillary phenomenon to occur.

* * * * *